(12) United States Patent
Honda et al.

(10) Patent No.: US 6,249,598 B1
(45) Date of Patent: *Jun. 19, 2001

(54) SOLDER TESTING APPARATUS

(75) Inventors: Toshifumi Honda, Funabashi; Yukio Matsuyama, Tochigi-ken, both of (JP); Guenter Doemens, Holzkirchen (DE); Peter Mengel, Eichenau (DE); Ludwig Listl, Munich (DE)

(73) Assignees: Hitachi, Ltd., Tokyo (JP); Siemens Aktiengesellshaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/968,125

(22) Filed: Nov. 12, 1997

(30) Foreign Application Priority Data

Nov. 12, 1996 (JP) .................................................. 8-300467

(51) Int. Cl.[7] ...................................................... G06K 9/00
(52) U.S. Cl. ...................... 382/150; 382/146; 250/559.34
(58) Field of Search ..................................... 382/146–150, 382/154, 170; 348/87, 126; 702/82, 152, 34; 356/375, 376, 384, 394, 237.4, 237.5; 700/110, 121; 250/559.2, 559.27, 559.34, 559.46

(56) References Cited

U.S. PATENT DOCUMENTS

| 4,628,531 | * | 12/1986 | Okamoto et al. | ........................ 382/8 |
| 4,894,790 | * | 1/1990 | Yotsuya et al. | ...................... 364/552 |
| 4,988,202 | * | 1/1991 | Nayar et al. | ........................... 356/394 |
| 4,999,785 | * | 3/1991 | Schmuter | ................................ 382/150 |
| 5,027,418 | * | 6/1991 | Ikegaya et al. | ....................... 382/150 |
| 5,058,178 | * | 10/1991 | Ray | ....................................... 382/150 |
| 5,076,697 | * | 12/1991 | Takagi et al. | ......................... 356/376 |
| 5,148,375 | * | 9/1992 | Horikami | .............................. 382/150 |
| 5,245,671 | * | 9/1993 | Kobayashi et al. | ...................... 382/8 |
| 5,267,217 | * | 11/1993 | Tokura et al. | ......................... 356/237 |
| 5,555,316 | * | 9/1996 | Tsujikawa et al. | .................. 382/150 |
| 5,598,345 | | 1/1997 | Tokura | .................................. 364/482 |
| 5,621,811 | * | 4/1997 | Roder et al. | ........................... 382/147 |
| 5,822,449 | * | 10/1998 | Kobayashi et al. | .................. 382/141 |

FOREIGN PATENT DOCUMENTS

| 41 39 189 A1 | 11/1992 | (DE) . |
| 0 195 161 A1 | 9/1986 | (EP) . |
| 0 685 732 A1 | 12/1995 | (EP) . |
| 62-261148 | 11/1987 | (JP) . |
| 8-193816 | 7/1996 | (JP) . |
| 8-327559 | 12/1996 | (JP) . |

OTHER PUBLICATIONS

Electronic Packaging Technology, vol. 9, No. 2, pp. 67–71 and English translation thereof.

* cited by examiner

Primary Examiner—Leo Boudreau
Assistant Examiner—Brian P. Werner
(74) Attorney, Agent, or Firm—Antonelli, Terry, Stout & Kraus, LLP

(57) ABSTRACT

A solder testing apparatus comprising image processing means for performing image processing on an image of an appearance of a soldered portion to identify shape characterizing amounts for the soldered portion; and defect determining means for performing good/bad determination on the soldered portion from data derived by the image processing means and data from test parameter storing means for storing shape characterizing amounts at design time, wherein tested-object standard shape estimating means is included for extracting shape characterizing amounts of a non-defective soldered portion by statistically processing shape characterizing amounts for soldered portions identified by the image processing means, and defect determining parameters stored in the test parameter storing means are updated based on standard shape values from the tested-object standard shape estimating means, so that a highly reliable test is realized by setting defect determining parameters based on actual shapes and dimensions of leads and pads of electronic components on a printed circuit board.

21 Claims, 12 Drawing Sheets

FIG. 10
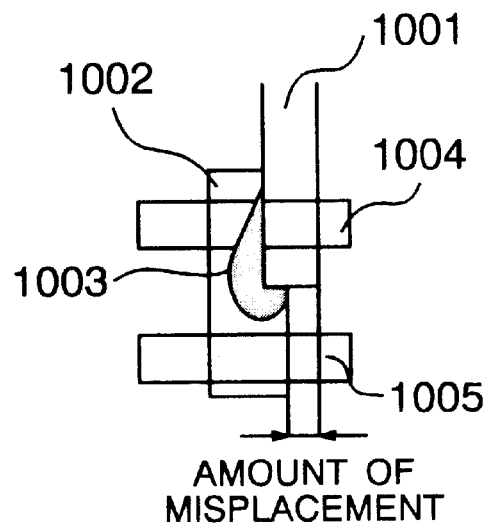
AMOUNT OF MISPLACEMENT
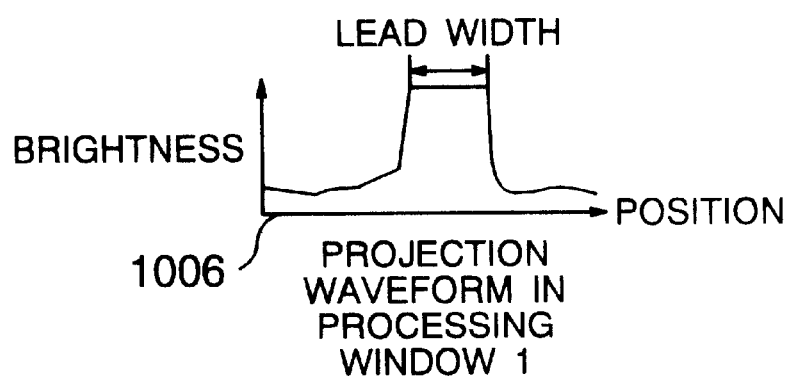
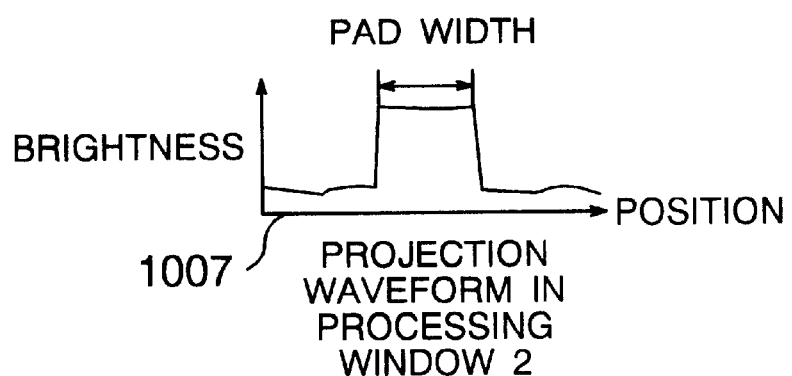

SOLDER TESTING APPARATUS

BACKGROUND OF THE INVENTION

The present invention relates to an apparatus for testing soldering states of electronic components mounted on a printed circuit board, and more particularly to a solder testing apparatus for use in a manufacturing process where correct model numbers of electronic components on printed circuit boards cannot be generally identified due to the electronic components having the same electric characteristics being supplied from a plurality of manufactures, or the like.

As for an apparatus for testing soldering states of electronic components mounted on printed circuit boards, there have been failure detecting techniques, for example, as in a high speed solder appearance testing apparatus SV2000 described in Electronic Package Technology, Vol. 9, No. 2, 1993. Specifically, when disturbance occurs, or when a new type of boards are tested for the first time, several boards, appearing to be non-defective, are extracted from a lot and applied to the apparatus to derive a mean value and dispersion from their characterizing amounts, and a failure is determined if the characterizing amounts detected from an object under testing during a test deviate from the mean value of the previously derived characterizing amounts of the non-defective boards by a predetermined amount.

However, the above-mentioned prior art technique has difficulties in supporting disturbance in a process and frequent changes of parts mounted on boards during testing. Generally, even with printed circuit boards under testing of the same type, electronic components labelled with different model numbers, which have the same electric characteristics but possibly slightly different appearances, are often treated as the same components and mounted on the boards. When a plurality of component manufacturers provide electronic components having the same electric characteristics, appearances of the electronic components manufactured by different manufacturers, for example, a lead thickness, a lead width, and so on may slightly differ from each other.

Generally, electronic components used to be mounted on printed circuit boards are supplied from the most beneficial one of manufacturers, which manufacture the components having the same electric characteristics, in terms of the price, delivery time, and so on, at the time the electronic components are to be supplied. For this reason, components from different manufacturers may possibly be mounted on printed circuit boards of the same type depending on manufacturing periods. In the prior art, test data is newly created from non-defective boards only when disturbance occurs in a process during testing. Generally, however, information on used electronic components and changes in processes is not available in a testing step.

For this reason, conventionally, a plurality of components labelled with different model numbers, having electrodes of slightly different design dimensions, have been inevitably subjected to testing using the same image processing parameters and defect determining parameters. Also, while the prior art relies on a mean value for determining a defect, it is difficult for this scheme to conduct a test based on testing specifications used in manufacturing sites. Generally, in manufacturing sites, the testing specifications are generally determined in many cases based on the shapes of leads and pads, for example, a failure is determined when a lead deviates from a pad by three percents or more of the width of the lead. However, since the prior art does not obtain these shapes from images, a highly reliable test cannot be realized.

SUMMARY OF THE INVENTION

It is an object of the present invention to realize a highly reliable test by setting image processing parameters and failure determining parameters based on actual shapes and dimensions of electrode portions (leads) and pads of electronic components mounted on printed circuit boards under testing.

The above object is realized by the following configuration.

A solder testing apparatus comprising image detecting means for detecting an appearance image of a soldered portion of an electronic component under testing mounted by soldering leads of the electronic component to pads on a printed circuit board, image processing means for performing image processing on the appearance image to identify shape characterizing amounts of the soldered portion, test parameter storing means for storing image processing parameters used in the image processing means and defect determining parameters used for determining whether the soldered portion is good or bad, and defect determining means for determining whether the soldered portion is good or bad from data derived from the image processing means and the defect determining parameters stored in the test parameter storing means, wherein the image processing means identifies shape factors of a lead and a pad and/or a shape factor of a solder fillet for each soldered portion as shape characterizing amounts for the soldered portion, and the solder testing apparatus has tested-object shape accumulating means for storing shape characterizing amounts of soldered portions identified by the image processing means, tested-object standard shape estimating means for statistically processing the shape characterizing amounts for soldered portions, accumulated in the tested-object shape accumulating means for each model, to identify, from the stored shape characterizing amounts for soldered portions, shape characterizing amounts corresponding to shape factors of leads and pads and shape factors of defective solder. fillets which exhibit a low detecting frequency or which cannot be normally derived theoretically from a structural viewpoint, as unnecessary shape characterizing amounts, and to identify shape characterizing amounts corresponding to shape factors of leads and pads and/or shape factors of non-defective solder fillets which exhibit a high detecting frequency as standard shape characterizing amounts, and for extracting the standard shape characterizing amounts from the accumulated shape characterizing amount for the soldered portions, and test parameter updating means for updating the image processing parameters and the defect determining parameters stored in the test parameter storing means based on the standard shape characterizing amounts.

A detecting optical system provided in the solder testing apparatus detects an image of a soldered portion under testing, and this image is processed by the image processing means. The image processing means detects shapes and dimensions of leads and pads of electronic components from images, and accumulates the detection results in the tested-object shape accumulating means. At the time detection has been terminated for a complete board or a plurality of boards, a histogram for detected shapes is derived for each type of lead or pad, and values presenting maximum frequencies are determined to be standard shape characterizing amounts for actual shapes of a lead or a pad and of a solder fillet.

The image processing parameters and the defect determining parameters are updated in test data updating means based on the above-mentioned standard shape characterizing amounts. Since test data are constantly updated, irrespective of before the test or during the test, based on standard shape characterizing amounts for the shapes and dimensions of leads and pads and for solder fillets derived from actually detected images, it is possible to conduct the test using the most appropriate test data for components under test even if model numbers of mounted components have been changed in the middle while a plurality of boards of the same type are being tested in succession.

BRIEF DESCRIPTION OF THE DRAWINGS

FIG. 10 is an embodiment of a testing algorithm for the solder testing apparatus according to the present invention.

DESCRIPTION OF THE PREFERRED EMBODIMENTS

Figure 1:
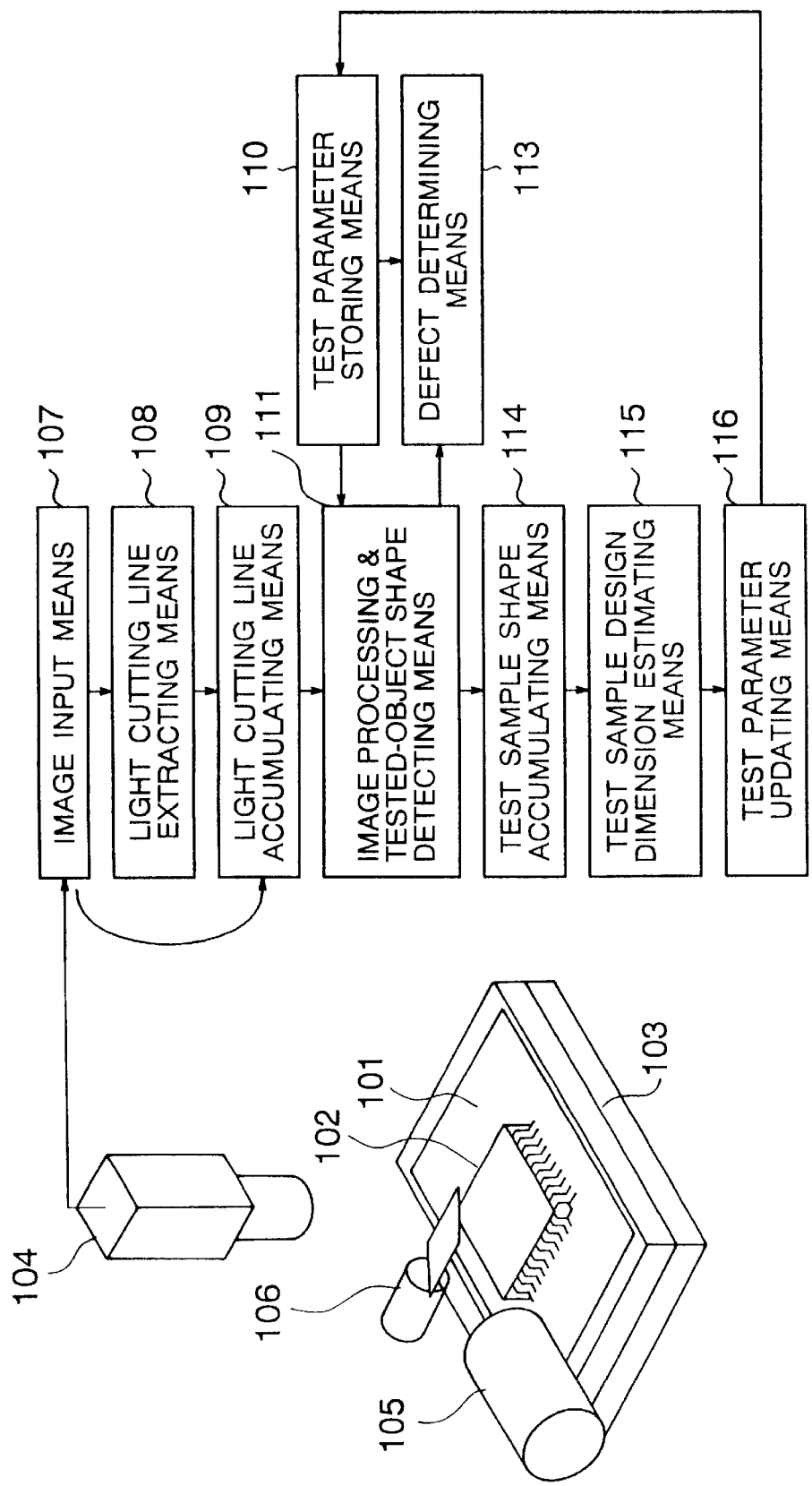
FIG. 1 is a schematic configuration diagram illustrating a main portion of a first embodiment of a solder testing apparatus according to the present invention.

The present invention will hereinafter be described with reference to FIGS. 1–13. Here, reference numeral 101 designates a printed circuit board; 102 an electronic component under testing; 103 an XY stage; 104 an image detector; 105 a slit light projector; 106 a galvano mirror; 107 an image input means; 108 a light cutting line extracting means; 109 a light cutting line accumulating means; 110 a test parameter storing means; 111 a image processing and tested-object shape detecting means; 113 a defect determining means; 114 a tested-object shape accumulating means; 115 a tested-object design dimension estimating means; 116 a test parameter updating means; 201, 301, 401 leads; 202, 302, 402 pads; 203, 403 solder fillets; and 204, 404 image processing windows, respectively.

FIG. 1 illustrates an example of a general configuration of the present invention. 101 designates the printed circuit board under testing. 102 designates the electronic component mounted on the printed circuit board. The printed circuit board is fixed on the XY table 103. 104 designates the image detector. Since the XY table 103 is movable in X- or Y-direction, an image at any position on the printed circuit board can be detected by the image detector 104.

105 designates the slit light projector, which is capable of irradiating an object under testing through the galvanomirror 106. Slit light irradiated to an object under testing is detected by the image detector 104, and converted into a digital image in the image input means 107. A two-dimensional image, after converted to a digital image in 107, is converted into one-dimensional waveform data indicative of a height at a slit light irradiating position in the light cutting line extracting means 108. In other words, the height of the object under testing can be derived by a known light cutting method.

The foregoing processing is performed while scanning a slit light irradiating position by changing the angle of the galvanomirror 106, to detect a large number of one-dimensional height waveform data which are stored in the light cutting line accumulating means 109. Brightness of the slit light at each light cutting line extracting position is also stored in 109 in combination. In the image processing and tested-object shape detecting means 111, an image processing window is set based on pad design position data stored in the test parameter storing means 110, and image processing is performed on each light cutting line within the image processing window to detect the shape of the object under testing.

Figure 2:
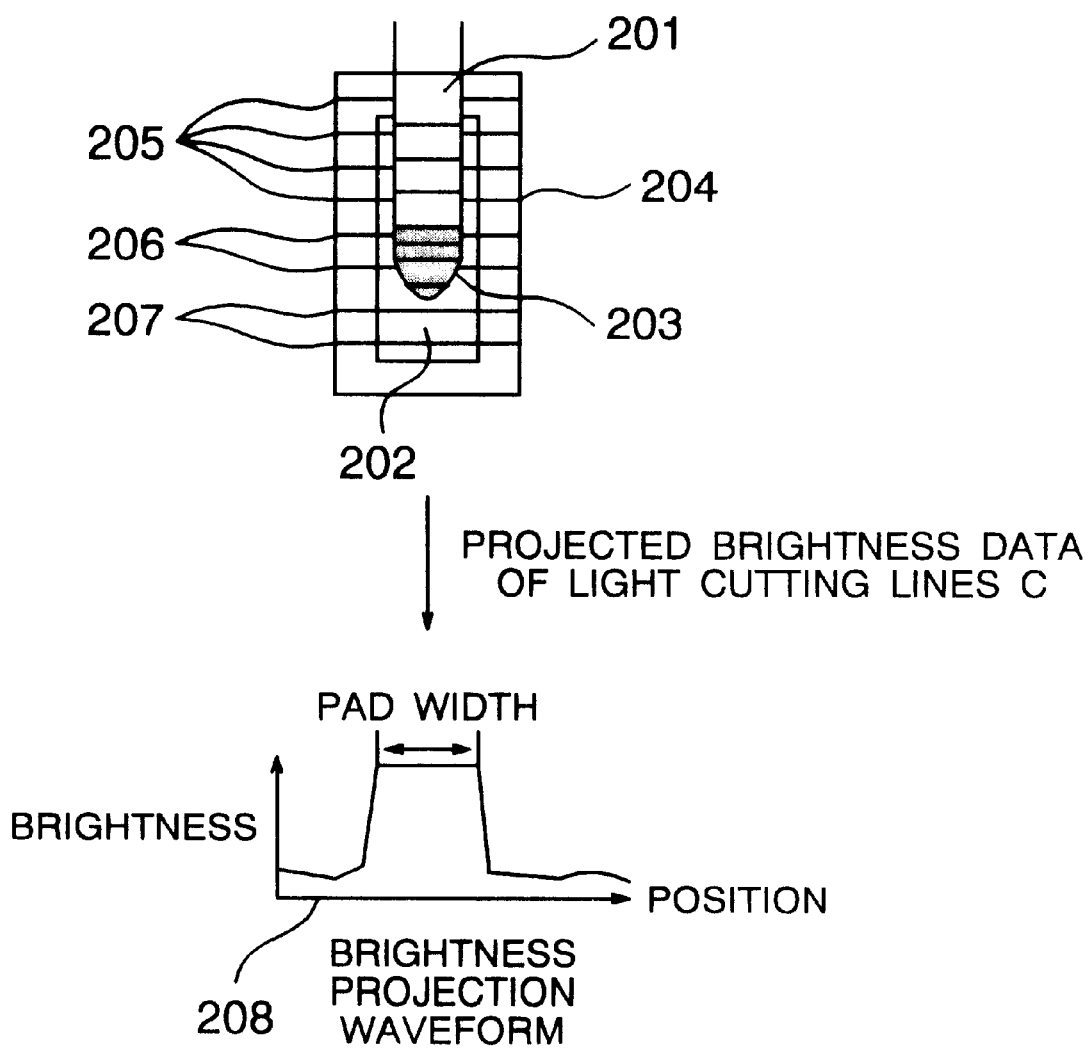
FIG. 2 is an embodiment of a testing algorithm for the solder testing apparatus according to the present invention.

More specifically, in FIG. 2, an image processing window 204 is set for testing a soldered portion at the tip of a lead 201, and light cutting lines A detected on the lead 201 within a light cutting line waveform in 204 are digitized by a height threshold value stored in the test parameter storing means 110 (which stores a lead thickness, a lead width, a pad width of an object under testing previously inputted by the user, and which stores and updates a lead thickness, a lead width, and a pad width estimated by actual measurements made to those of the object under testing). Edges of the digitized waveform are determined to be side edges, and the height of the top surface of the lead is derived based on a height indicated by the light cutting lines between these edges. Next, the height of the surface of a pad or the board is derived from light cutting lines 207 detected on a pad portion 202.

Next, from light cutting lines 206 detected on the solder fillet 203, a light cutting line portion higher than the pad height derived from the light cutting lines 207 is determined to be a solder fillet. Also, data on brightness of the slit light at a light cutting line extracting position 207 is projected in the direction indicated in FIG. 2 to produce a projection waveform illustrated in 208, and these edge positions are determined to be side edges. These detection results are accumulated in the tested-object shape accumulating means 114.

After the foregoing processing has been performed, a height shape at a position to which no light cutting lines have been irradiated, i.e., a height shape of the entire object under testing is determined based on interpolation of heights indicated by the two light cutting lines closest to that position, in the image processing and tested-object shape detecting means 111.

Next, it is determined in the defect determining means 113 whether or not an associated soldered portion is defective. Whether or not the lead is lifted is determined by the height h1 of the top surface of the lead and the height ph of the height of the pad derived by the image processing and tested-object shape detecting means 111. Assuming that a design thickness of the lead stored in the test parameter storing means is designated "thick," a lift amount "lift" of the lead from the pad is calculated as follows:

lift=h1-hp-thick

When lift is equal to or more than a constant threshold value, the lead is detected as lift failure. Also, a lead misplacement"misplacement" is calculated as follows, based on the side edges le of the lead and the side edge pe of the pad:

misplacement=|le-pe|

Here, the lead is detected as misplacement failure if the lead is deviated from the pad toward the outside, and misplacement is equal to or more than a constant ratio with respect to a design width 1w of the lead stored in a test parameter.

As described above, since the lift failure and the misplacement failure are determined using a design thickness and a design width of a lead, provided as test parameters, accurate design thickness and design width of the lead are essential for realizing a highly reliable test. However, in actual electronic board mounting sites, components having the same electric characteristics are generally supplied from a plurality of manufacturers, and the components having the same electric characteristics are treated completely the same irrespective of the manufacturers of the components. However, since these components often differ slightly from each other in actual shape, it is difficult to have previously created test data which describes accurate component dimensions.

Also, since the dimensions of leads, particularly lead thicknesses, have a large error margin in design dimensions, it is difficult to independently measure accurate dimensions for all components in the working sites, even if component manufacturers can be identified. For this reason, the present invention updates the test parameters based on the detected shapes and dimensions of the electrodes (leads) and the pads detected in the image processing and tested-object shape detecting means 111.

The tested-object design dimension estimating means 115 estimates the dimension of a component based on the shape of an object under testing detected by the image processing and tested-object shape detecting means 111. First, a method of estimating a lead thickness will be described with reference to FIG. 3. When the detecting optical system of FIG. 1 is employed, a height to be detected is the height of the top surface 301 of the lead with reference to the pad 302. 303 designates a normal lead; 304 a lead with lift failure; and 305 a lead with misplacement failure.

A detected height is higher than the lead thickness in 304 because lift has occurred, and is lower than the lead thickness in 305 because the lead slips off from the pad to cause misplacement. 306 illustrates a histogram of lead heights detected for components of the same type mounted on all printed circuit boards. While the occurrence of failures such as 304 or 305 causes a detected height to be higher or lower than the lead thickness, it is generally known that a failure occurring ratio in actual manufacturing sites is at most 1% or less, so that the peak of the histogram 306 indicates the lead thickness. Alternatively, a mean value of lead thicknesses may be used instead of the histogram of the peak.

When a manufacturing process for a printed circuit board is modified, for example, by introducing a new reflow furnace, the process is not stabilized so that it can be thought that a large amount of failures will result, where a maximum peak is not necessarily a lead thickness.

Figure 3:
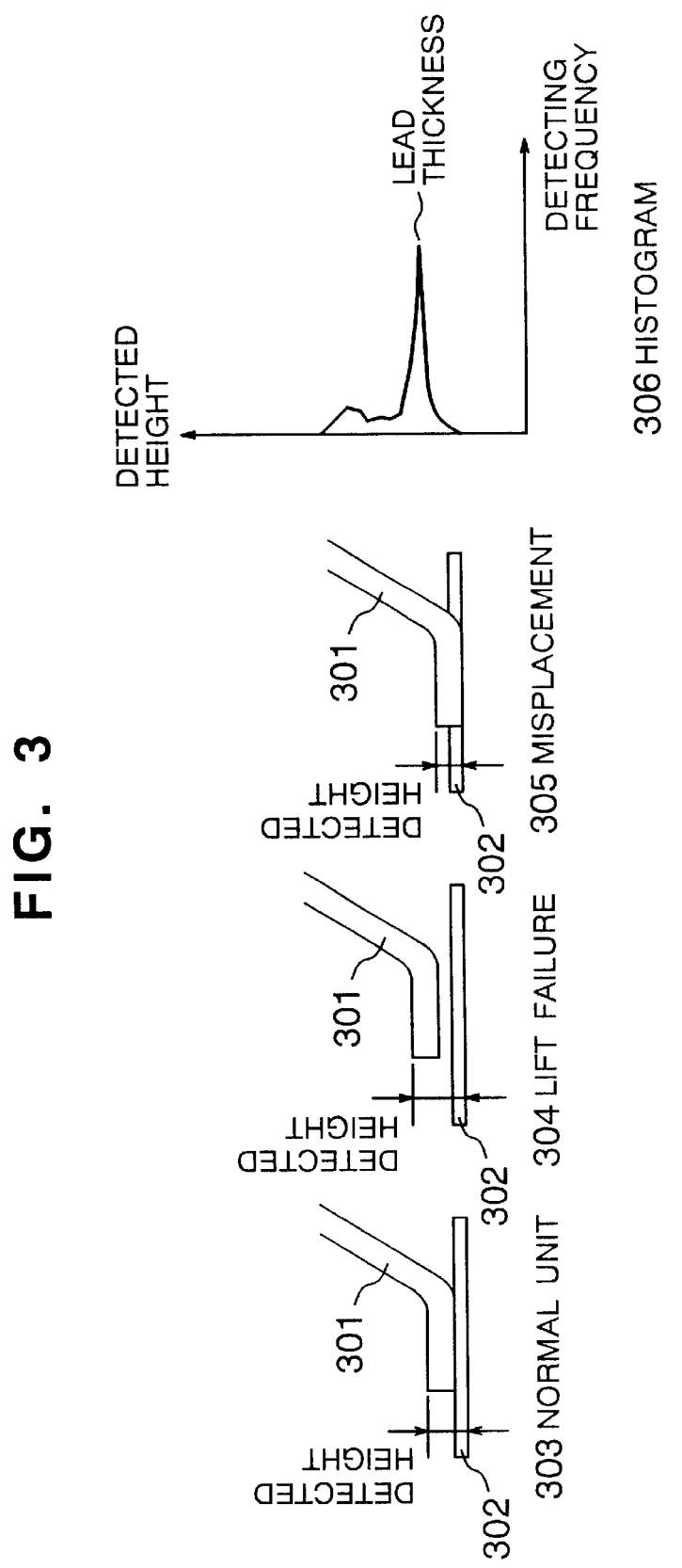
FIG. 3 is an embodiment of a lead thickness detecting algorithm for the solder testing apparatus according to the present invention.

In this case, the misplacement failure detection is first conducted, and a histogram is calculated only from lead heights of leads, which are determined to be free from misplacement failure as a result, and the lowest peak of peaks in the histogram is designated as a normal lead thickness, thereby making it possible to detect an accurate lead height. This is because, as illustrated in FIG. 3, the height of a lead, slipped off a pad, is detected to be lower than a lead thickness, while it is otherwise detected to be equal to or higher than the lead thickness. Therefore, when a histogram is calculated for lead heights of leads free from misplacement failure, the lowest peak is equal to the lead thickness.

Figure 4:
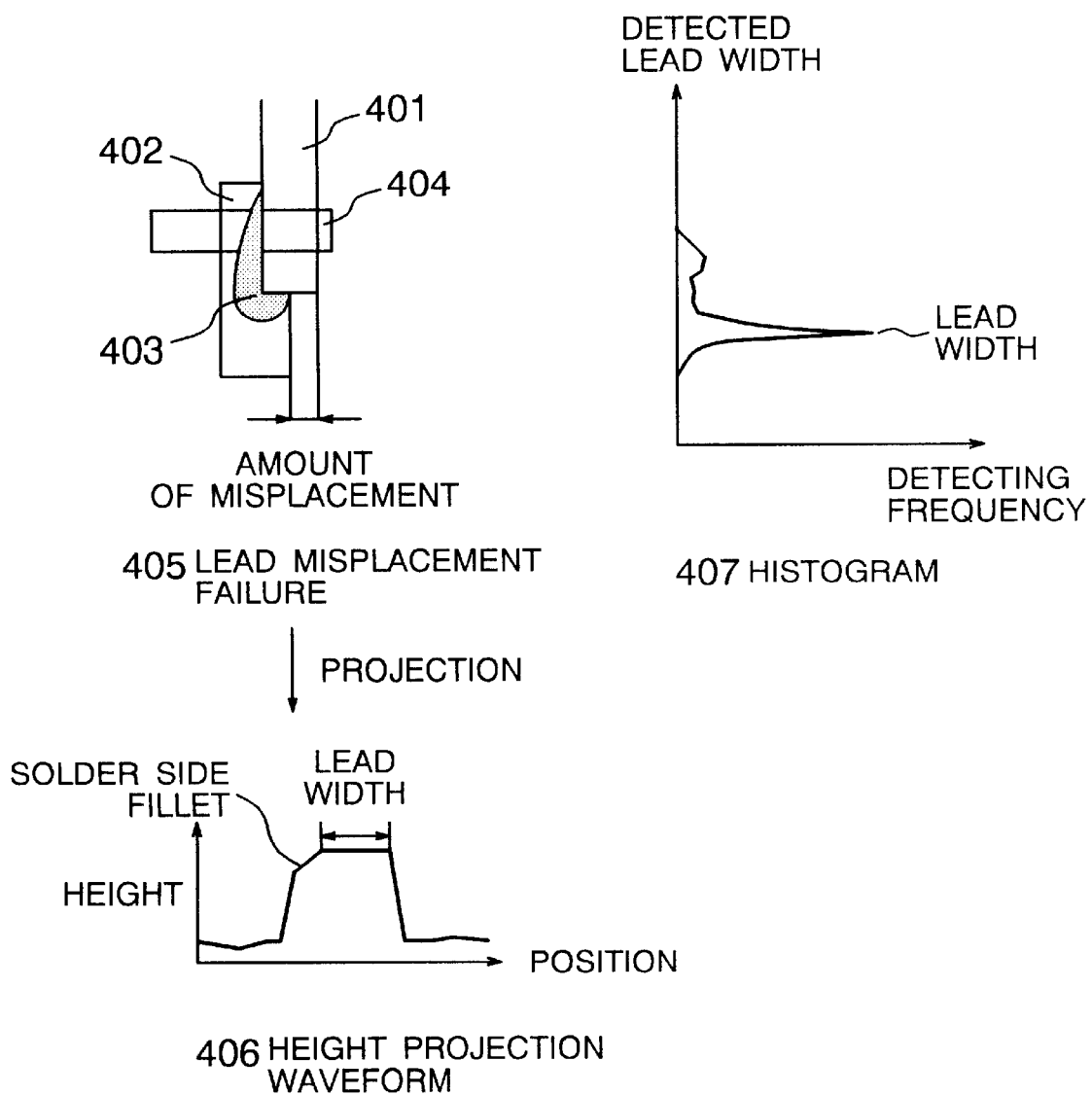
FIG. 4 is an embodiment of an algorithm for detecting a lead width and a pad width for the solder testing apparatus according to the present invention.

A method of estimating a lead width will be described with reference to FIG. 4. 405 is a diagram illustrating a lead misplacement failure, where a lead 401 deviates from a pad 402. 406 is a projection waveform produced in this event when light cutting line data detected within a processing window is projected in the direction indicated in the figure. In 405, a solder fillet 403 attaches mostly to a side portion of the lead due to misplacement of the lead, so that a lead portion cannot be easily distinguished from a side fillet portion from the projection waveform 406.

In such a case, the image processing and tested-object shape detecting means 11 may often detect a lead width including a side fillet. However, since the failure occurring ratio is low in actual manufacturing sites as mentioned above, an actual lead width can be detected as a maximum peak of a histogram 407 when the histogram is derived for detected lead widths for a complete board.

Likewise, when a lead width is estimated, lead misplacement may frequently occurs if modifications in a manufacturing process causes the process to be instable, whereby the largest detection frequency does not always indicate the lead width. As described above, since a lead misplacement causes the lead width to be detected with a side fillet included therein, the lead width is detected wider, but not narrower. Therefore, the narrowest one of peaks in a histogram for detected lead widths may be designated as the lead width.

A pad width can also be derived from the pad side edges detected by the image processing and tested-object shape detecting means 111.

After estimating the shapes and dimensions of an object under testing as described above, test parameters are updated in the test parameter updating means 116. More specifically, described in the test parameter storing means 110 are those previously inputted by the user and those actually used in a test as a lead thickness, a lead width, and a pad width of an object under testing. A lead thickness, a lead width, and a pad width detected from images are compared with respective values previously inputted by the user, and when the values detected from the images are extremely different from the values inputted by the user, the updating is not performed as an error has taken place in the detection of the shapes of the dimensions from the images.

Otherwise, the lead thickness, the lead width, and the pad width detected from the images are stored as values to be actually used for a test. For example, the image processing and tested-object shape detecting means 111 digitizes the light cutting lines A 205 in FIG. 2 for detecting side edges of a lead as described above, where a proper threshold value for this purpose may be the value approximately one half of the lead thickness. Therefore, the value of the lead thickness multiplied by 0.5 is stored as an image processing parameter.

Also, since a design width and a design thickness of a lead are required as defect determining parameters for determining defects in the defect determining means 113 as mentioned above, the design width and the design thickness of the lead (electrode) calculated in the tested-object design dimension estimating means 115 are stored as defect determining parameters, respectively, in the defect determining means. Also, the values calculated in the tested-object design dimension estimating means are used not only as the defect determining parameters but also as image processing parameters in the image processing and tested-object shape detecting means through the test parameter storing means.

Next, an update timing for the test parameters will be described with reference to FIG. 5. After an image is detected, the processing of the image processing and tested-object shape detecting means 111 and the defect detecting means 113 in FIG. 1 is executed before detection of the next image is completed. This is performed until all images of a complete printed circuit board have been detected. After the image detection and the image processing are completed, the dimension of an object under testing is estimated in the tested-object design dimension estimating means 115 while the testing apparatus is loading a next printed circuit board under testing, and subsequently test parameters are updated.

While a method of estimating shapes and dimensions of an electrode portion and a pad portion based only on the detection results of a complete printed circuit board has been described with reference to FIG. 5, some components mounted on a printed circuit board are extremely few in number, in which case the histogram illustrated in FIG. 3 or FIG. 4 cannot be satisfactorily calculated. In this case, shapes and dimensions may be estimated based on the detection results of electrode portions and pad portions detected from a plurality of printed circuit boards. A timing chart for this is illustrated in FIG. 6.

However, it is not necessary to accumulate the detection results of electrodes of one type on a plurality of printed circuit boards, when a large number of them are mounted on a single board. If this were performed, a large accumulating region would be reserved in the tested-object shape accumulating means 114 in FIG. 1. To prevent this, detection results from a different number of printed circuit boards may be used for each type of electrodes.

Figure 5:
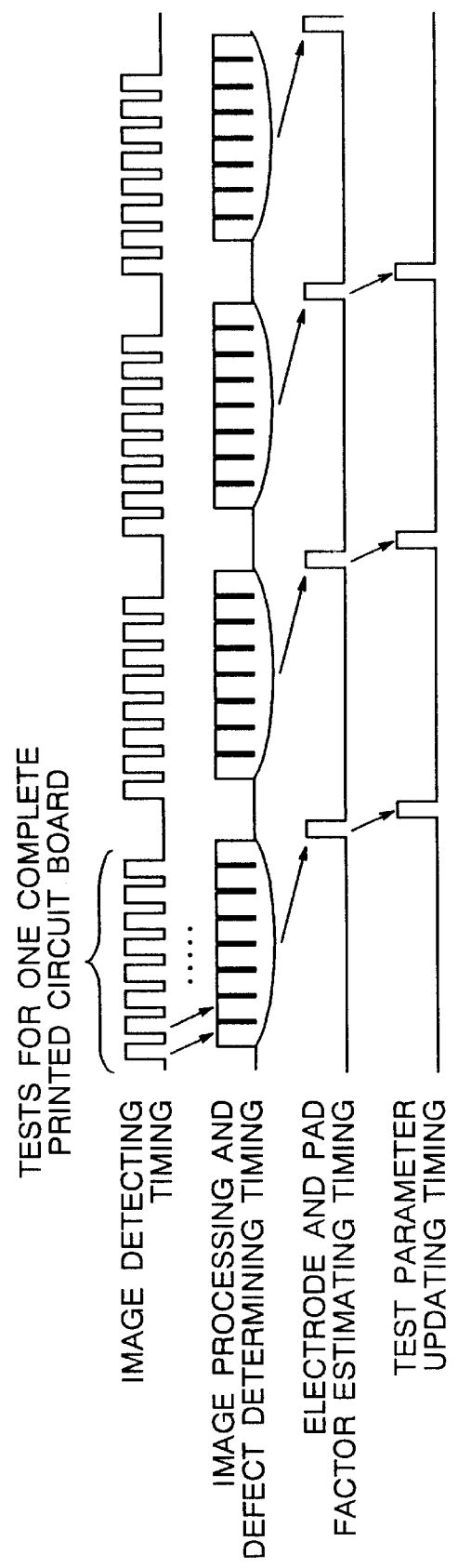
FIG. 5 is an embodiment of a testing sequence for the solder testing apparatus according to the present invention.
Figure 6:
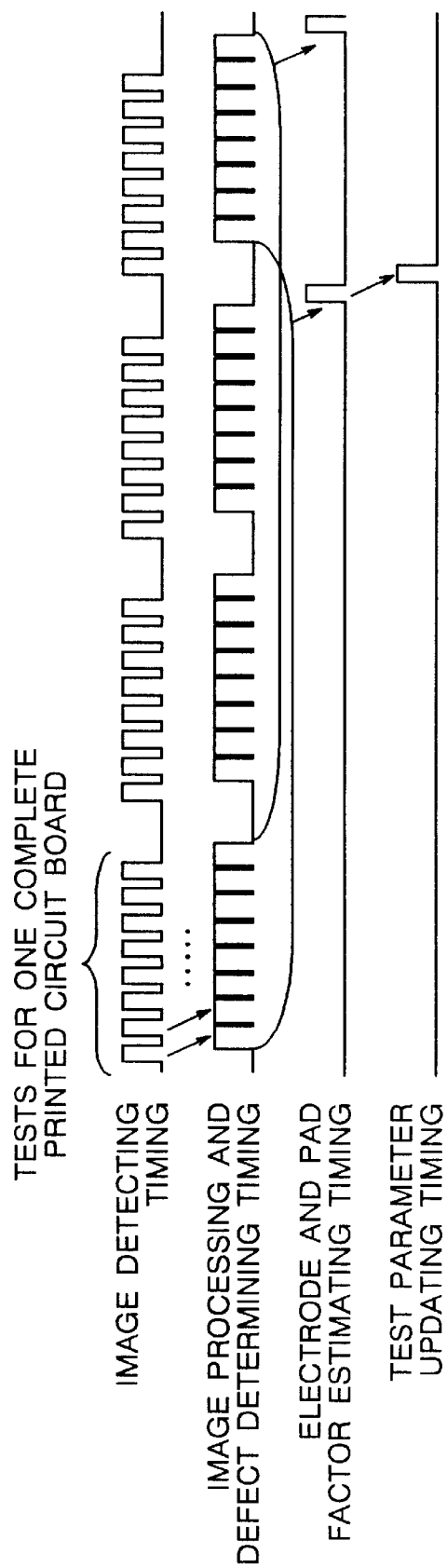
FIG. 6 is an embodiment of a testing sequence for the solder testing apparatus according to the present invention.
Figure 7:
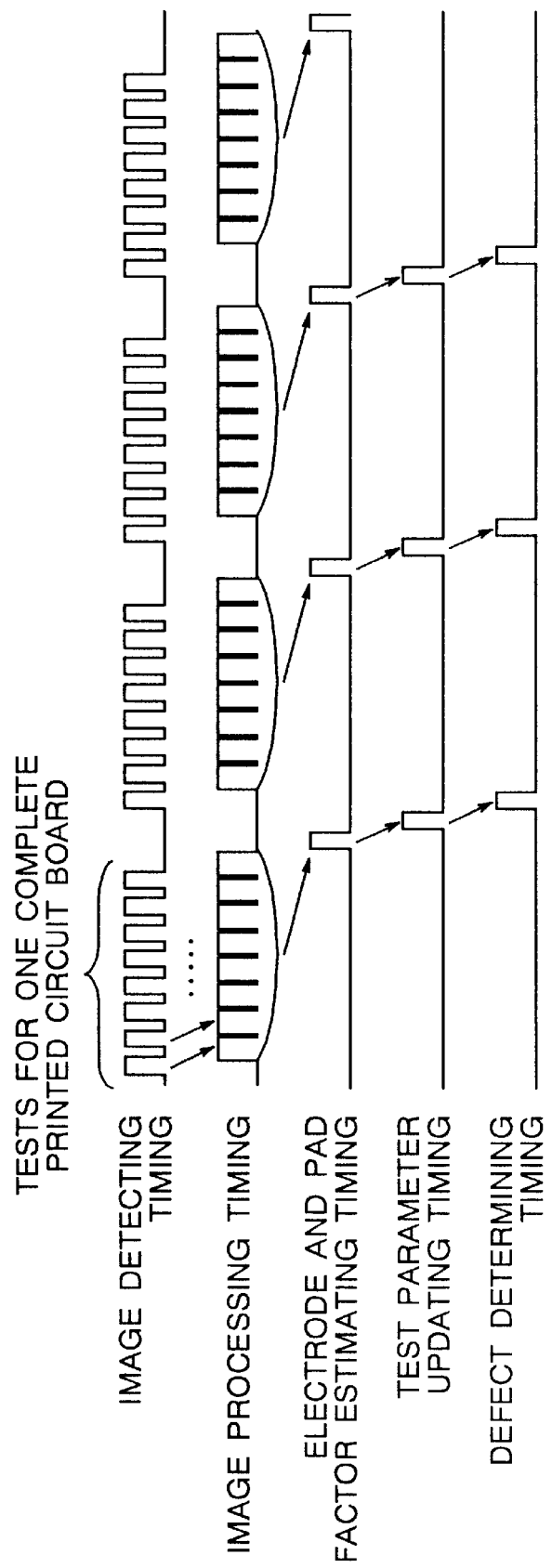
FIG. 7 is an embodiment of a testing sequence for the solder testing apparatus according to the present invention.

When the timing chart illustrated in FIG. 5 is used, a problem may arise in that the test may be conducted using inaccurate dimensions of an electrode (lead) and a pad for a printed circuit board which is subjected to the test for the first time after the type of component has been changed. FIG. 7 illustrates a timing chart for preventing this. In FIG. 7, the processing of the image processing and tested-object shape detecting means 111 is performed each time an image is detected to derive the shape of an object under testing and to accumulate the detection results, i.e., the positions of side edges of a lead, the positions of side edges of a pad, and the height of a top surface of the lead, in the tested-object shape accumulating means. After this processing is performed for a whole printed circuit board, characterizing amounts are estimated in the tested-object design dimension estimating means 115 in FIG. 1, and then defect determination is performed based on the shapes of objects under testing on a complete printed circuit board, which have been accumulated in the tested-object shape accumulating means 114, thereby making it possible to realize the defect determination using accurate dimensions of the electrode and the ad.

Figure 8:
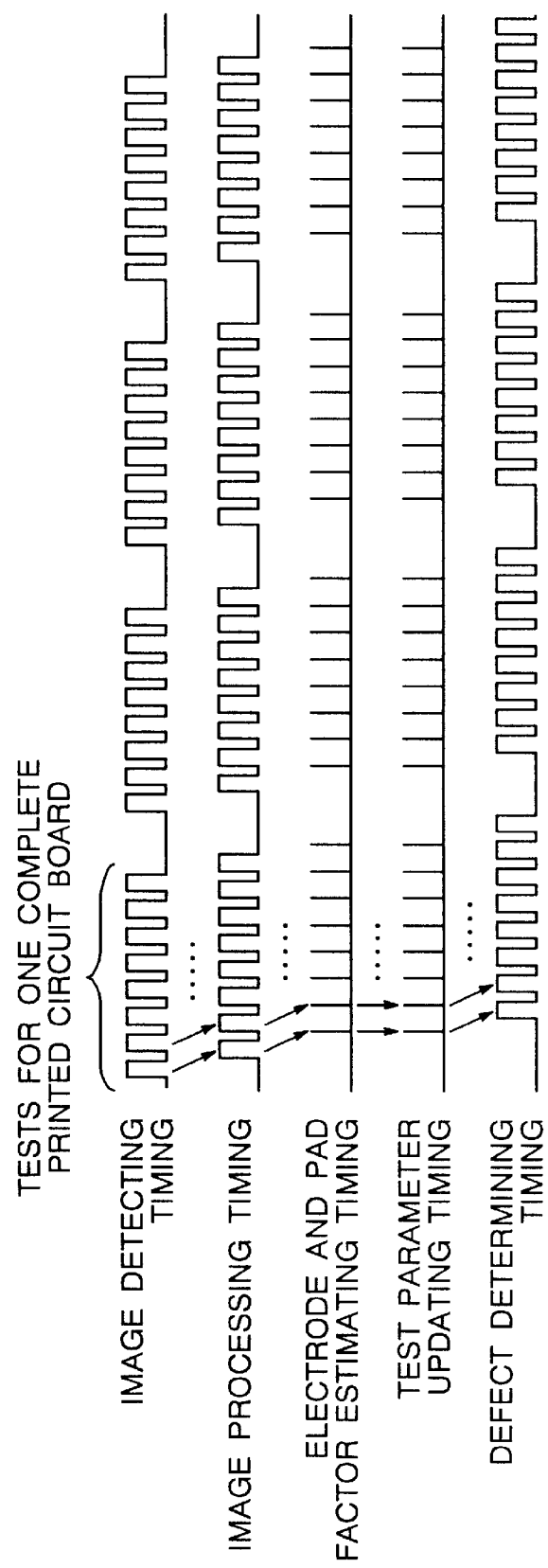
FIG. 8 is an embodiment of a testing sequence for the solder testing apparatus according to the present invention.

While the previous description has been made on the assumption that test parameters are updated after all images of a complete printed circuit board have been detected, a large number of soldered portions may be detected in a field of view of the image detector 104 in the exemplary configuration illustrated in FIG. 1, for example, when a component comprises an extremely large number of electrodes, for example, in the case of a 0.5 mm pitch QFP (quad flat package). In this case, it is possible to estimate shapes and dimensions of electrodes and pads in each field of view. A timing chart for this approach is as illustrated in FIG. 8. An advantage provided in this case is that an accumulating region can be reduced in the tested-object shape accumulating means 114.

In the case where the model number of a mounted component is previously known, or the like, a more reliable test may be realized by again utilizing test parameters which were derived when a component of the same model number was used before. Generally, since the model number of a component is seldom changed many times a day, the storage unit is adapted to be able to automatically preserve the test parameters as backup for each day. By again utilizing test parameters of a date when the same model number of component was used, it is possible to omit a work for again updating the test parameters based on test images.

While the test apparatus described in connection with FIG. 1 detects an image with an optical system composed of a TV camera and a slit light projector to test components mounted on a printed circuit board, the present scheme is effective with any method of detecting a three-dimensional shape. For example, the present approach is also applicable to a light section method which combines a laser spot and PSD (position sensing detector), or the like.

Figure 9:
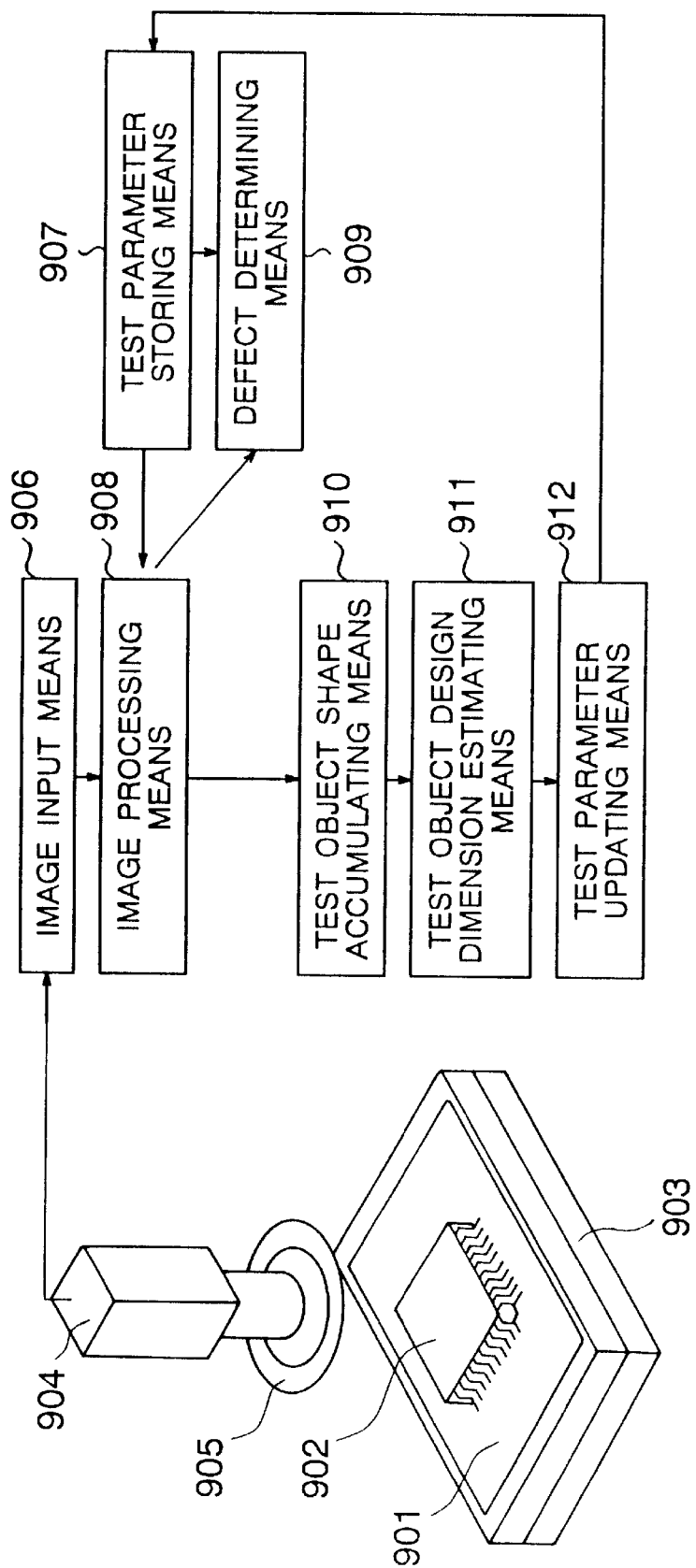
FIG. 9 is a schematic configuration diagram illustrating a main portion of an embodiment of a solder testing apparatus according to the present invention.

Also, the present invention may be applied to an apparatus which detects an image with an optical system which does not detect a three-dimensional shape, as illustrated in FIG. 9. 901, 902, 903 designate a printed circuit board, an electronic component under testing, and an XY stage, respectively, which are similar to FIG. 1. 904 designates an image detector which detects an image of the electronic component 902 illuminated by a ring illuminator 905. The diameter of the ring illuminator 905 is set to be small such that a bright-field illumination can be provided for 902.

906, 907 designate an image input means and a test parameter storing means, respectively, which are similar to the image input means 107 and the test parameter storing means 110 in FIG. 1. 908 designates an image processing means which detects the position of a lead and the position of a pad. When the bright-field illumination is performed, a lead and a pad, because of higher reflectivities of their surfaces, are detected righter than surrounding resist portions having a lower effectively. Stated another way, this is an approach which detects the position of an object under testing by a difference in brightness that is detected based on the difference in reflectivity.

As illustrated in FIG. 10, a processing window 1004 is set above a design position of the tip of a lead in the same figure. An image within the processing window 1, 1004 is projected in the vertical direction of the same figure to produce a brightness projection waveform 1006, and edges are detected from this waveform to derive the position of the lead.

Also, a processing window 2 is set below the design position of the tip of the lead in the same figure so as not to include a solder fillet. Similar processing to that for detecting the edges of the lead is performed on an image within the processing window 2 to detect the edges of a pad.

The defect determining means 909 derives the amount of misplacement of the lead based on the lead edges and the pad edges detected by the image processing means 908 as described above, and detects a misplacement failure if the ratio of the amount of misplacement to a design width of the lead is equal to or larger than a predetermined threshold value.

910 designates a tested-object shape accumulating means which records the positions of lead edges and ad edges detected in the image processing means 908. 911 and 912 designate a tested-object design dimension estimating means and a test parameter updating means, respectively. While the tested-object design dimension estimating means 115 in FIG. 1 estimates a lead thickness, a lead width, and a pad width, the tested-object design dimension estimating means 911 only estimates a lead width and a pad width. An algorithm for estimating a lead width and a pad width used herein may be similar to that of the tested-object design dimension estimating means 115. The test parameter updating means 912 performs processing completely similar to the test parameter updating means 116 to update the test parameters stored in the test parameter storing means 907.

While in FIG. 1 and FIG. 9, design dimensions of a lead and a pad are estimated in the tested-object design dimension estimating means 115, 911, respectively, based on the shape of an object under testing detected by the image processing means, it is also possible to estimate standard values for characterizing amounts of a soldered portion to perform a good/bad determination based on these standard values for the characterizing amounts, without limited only to the design dimensions.

Figure 11:
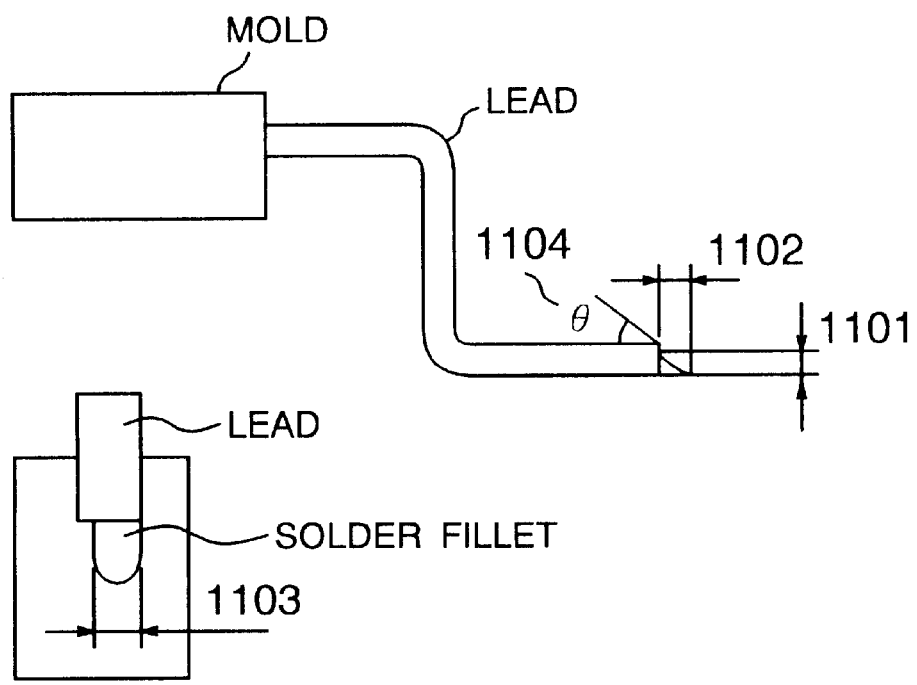
FIG. 11 is an example of a detected characterizing amount which is detected from an object under testing of the solder testing apparatus according to the present invention.

FIG. 11 illustrates an explanatory diagram for the characterizing amounts of a soldered portion. For determining whether a soldered state is good or bad, a fillet height 1101 indicative of a maximum height of a solder fillet in contact with a lead; a fillet length 1102 which is the length from the position of a lead toe to the tip of the fillet; a fillet width 1103 at the position of the lead toe; the volume of the fillet; an area of the fillet in contact with a pad or the lead; and a wet angle 1104 of the fillet to the lead are used as characterizing amounts.

As frequently used criteria for a non-defective unit, the fillet height is equal to or higher than a height previously determined for each type; the fillet width is in a predetermined proportion or more to the width of a lead; the volume of the fillet and the contact area with a pad or a lead are equal to or more than predetermined threshold values; and the wet angle of the fillet to the lead is equal to or more than a predetermined angle. Incidentally, the fillet height is closely related to the wet angle. Generally, when the fillet height is sufficiently high, the wet angle is small in relation to surface tension, in which case a lead and a pad are also favorably connected because of a large amount of solder. Thus, when these two characterizing amounts are combined to make up a determination item, a false result can be reduced. Specifically, a failure is determined when the wet angle is small and the fillet height is low, and a non-defective unit is determined in other combinations.

Generally, the appearance of a soldered portion is visually tested. Since it is difficult to strictly measure these characterizing amounts, testing criteria are seldom determined strictly for the characterizing amounts for a soldered portion.

In such a case, if the testing criteria can be automatically set based on characterizing amounts detected by the apparatus, a time for setting test parameters can be reduced. As mentioned above, the failure occurring frequency in printed circuit boards is at most 1% or less. For this reason, it is possible to identify that a portion with a high occurring frequency in a histogram for detected values of a characterizing amount of soldered portions calculated from a large number of soldered portions under testing is a feature indicating a non-defective unit.

Figure 12:
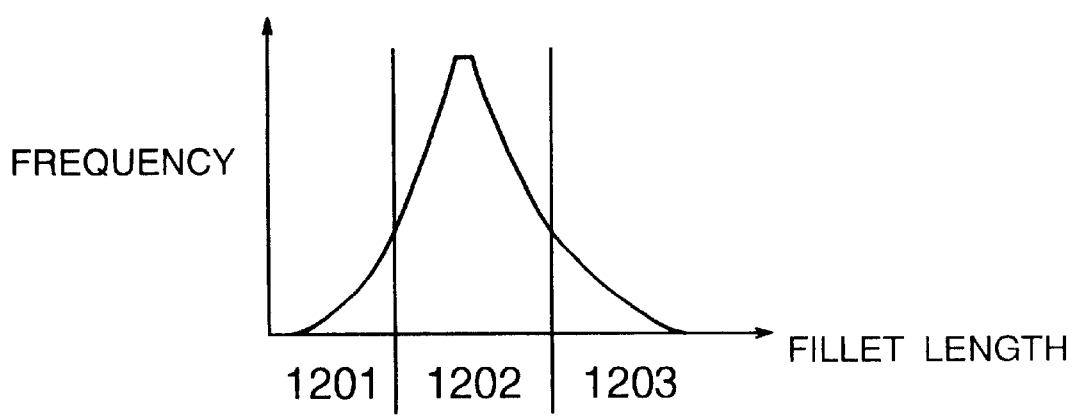
FIG. 12 is an example of correlation between a distribution of lengths of solder fillets, detected by the solder testing apparatus of the present invention, and a defect determining threshold value.

Conversely, a portion of the histogram with a high occurring frequency can be determined as a non-defective unit, while a portion with a low occurring frequency as a defective unit. For example, FIG. 12 illustrates a histogram for a solder fillet length. Generally, a solder fillet is required to have a length equal to or larger than a predetermined length. It is therefore possible to classify a region with a low occurring frequency 1201 as a defective unit, a region with a high occurring frequency 1202 as a non-defective unit, and a region 1203 as a non-defective unit since the fillet is not too short although the occurring frequency is low.

Figure 13:
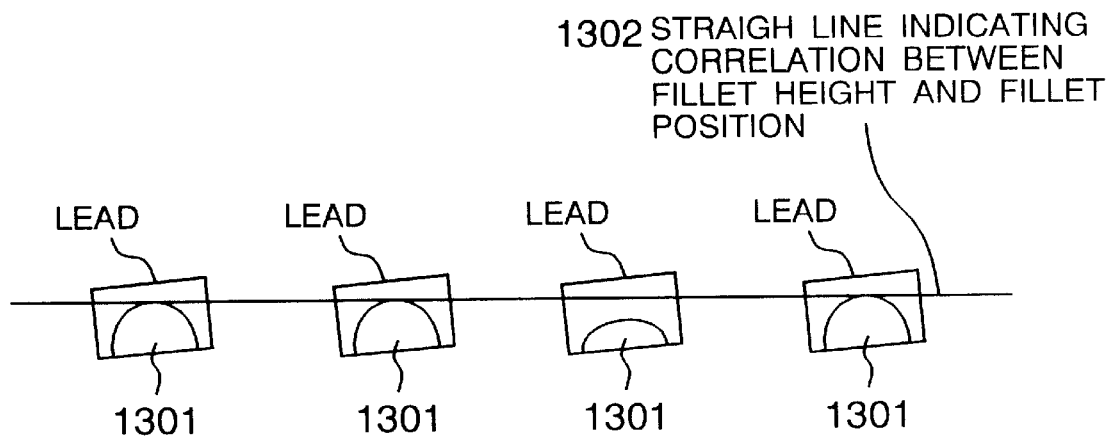
FIG. 13 is an example of a defect determining method based on heights of solder fillets detected by the solder testing apparatus of the present invention.

Next, FIG. 13 illustrates an example of heights of fillets when viewed from one side. 1301 designates solder fillets. When an image of a top surface of a printed circuit board is detected by the detection optical system illustrated in FIG. 1, a tilted top surface of the printed circuit board may be detected due to bowing of the printed circuit board. Since the top surface of the printed circuit board locally includes differences in height due to the presence and absence of resists and wiring patterns, it is difficult to accurately detect a tilted top surface of a printed circuit board. In such a case, the correlation between a fillet height and a fillet position is linearly approximated as indicated by 1302 using a least square method or the like, and a solder fillet spaced from this approximation line by a large distance is determined to be defective. Since the tilted top surface of the printed circuit board is in parallel with the gradient of the approximation line, it is possible to determine whether fillet a height is good or bad without being influenced by bowing of printed circuit boards.

As described above, while one of shape factors of a lead and a pad and shape factors of solder fillets is used as a test parameter, the solder testing apparatus is of course capable of accumulating both shape factors so as to conduct a test based on one of the shape factors. In addition, both shape factors may be accumulated to conduct a fine test based on both the shape factors.

As described above, the present invention can produce an effect of realizing a highly reliable test even when a plurality of model numbers of electronic components having the same electric characteristics are mounted as the same components by measuring their shapes and dimensions based on detected images to set test parameters.

What is claimed is:

1. A solder testing apparatus comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining parameters stored in said test parameter storing means;

wherein said image processing means calculates shape factors of a lead and a pad for each soldered portion as shape characterizing amounts for the soldered portion, and said solder testing apparatus further comprising:
tested-object shape accumulating means for storing shape characterizing amounts of soldered portions identified by said image processing means;

tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and test parameter updating means for updating the image processing parameters and the defect determining parameters stored in said test parameter storing means based on said standard shape characterizing amounts;

wherein said image processing means identifies, for each soldered portion, shape factors of a solder fillet, together with the shape factors of a lead and a pad, as shape characterizing amounts for the soldered portion; and wherein said tested-object standard shape estimating means statistically processes the shape characterizing amounts for the soldered portions stored in said tested-object shape accumulating means for each type of electronic component mounted on the printed circuit board to identify, from said accumulated shape characterizing amounts for the soldered portions, shape characterizing amounts corresponding to shape factors of leads and pads and shape factors of defective solder fillets which exhibit a low detecting frequency or which cannot be normally derived theoretically from a structural viewpoint, as unnecessary shape characterizing amounts, and to identify shape characterizing amounts corresponding to shape factors of leads and pads an shape factors of non-defective solder fillets which exhibit a high detecting frequency as standard shape characterizing amounts, and extracts said standard shape characterizing amounts from said accumulated shape characterizing amount for the soldered portions.

2. A solder testing apparatus according to claim 1, wherein said shape factors of solder fillets in said image-processing means comprise at least one of a height of a fillet, a width of the fillet, an area of the fillet in contact with a lead, a length of the fillet, a volume of the fillet, and a wet angle at a portion at which the fillet is in contact with the lead.

3. A solder testing apparatus according to claim 2, wherein said defect determining means performs good/bad determination in combination of said fillet height and said wet angle at a portion at which a fillet is in contact with a lead, and determines as defective if said fillet height derived from said appearance image is lower than a threshold value set in correspondence to said fillet height, and if said wet angle derived from said appearance image is smaller than a threshold value set in correspondence to said wet angle.

4. A solder testing apparatus, comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is food or bad from data derived from said image processing means and the defect determining parameters stored in said test parameter storing means;

wherein said image processing means calculates shape factors of a lead and a pad for each soldered portion as shape characterizing amounts for the soldered portion, and said solder testing apparatus further comprising:

tested-object shape accumulating means for storing shape characterizing amounts of soldered portions identified by said image processing means;

tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and test parameter updating means for updating the image processing parameters and the defect determining parameters stored in said test parameter storing means based on said standard shape characterizing amounts;

wherein the image processing parameters and the defect determining parameters updated by said test parameter updating means are recorded in a storage unit at predetermined time intervals together with model numbers of electronic components, date and time.

5. A solder testing apparatus according to claim 4, wherein said image processing parameters and said defect determining parameters recorded at predetermined time intervals are automatically preserved as backup when they have been recorded a predetermined number of times.

6. A solder testing apparatus comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining parameters stored in said test parameter storing means;

wherein said image Processing means calculates shape factors of a lead and a pad for each soldered portion as shape characterizing amounts for the soldered portion; and said solder testing apparatus further comprising:

tested-object shape accumulating means for storing shape characterizing amounts of soldered portions identified by said image processing means;

tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and test parameter updating means for updating the image processing parameters and the defect determining parameters stored in said test parameter storing means based on said standard shape characterizing amounts;

wherein said tested-object standard shape estimating means approximates the shape characterizing amounts accumulated in said tested-object shape accumulating means with a first-order straight line; and wherein said defect determining means determines whether a soldered portion is good or bad by comparing a shape characterizing amount of the soldered portion derived from said image processing means with said first-order straight line.

7. A solder testing apparatus comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining parameters stored in said test parameter storing means;

wherein said image processing means calculates shape factors of a lead and a pad for each soldered portion as shape characterizing amounts for the soldered portion; and said solder testing apparatus further comprising:
tested-object shape accumulating means for storing shape characterizing amounts of soldered portions identified by said image processing means;
tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and
test parameter updating means for updating the image processing parameters and the defect determining parameters stored in said test parameter storing means based on said standard shape characterizing amounts;
wherein said image detecting means is capable of detecting a surface height image of said object under testing;
wherein said image processing means detects a height of a top surface of a lead and a height of a surface of a pad from said surface height image;
wherein said tested-object shape accumulating means accumulates a value derived by subtracting the pad surface height from the lead top surface height as a lead thickness; and
wherein said tested-object standard shape estimating means estimates that a peak for the smallest lead thickness indicates an actual lead thickness within peaks in a histogram for lead thicknesses accumulated in said tested-object shape accumulating means.

8. A solder testing apparatus comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining Parameters stored in said test parameter storing means;

wherein said image processing means calculates shape factors of a lead and a pad for each soldered portion as shape characterizing amounts for the soldered portion, and said solder testing apparatus further compressing:
tested-object shape accumulating means for storing shape characterizing amounts of soldered portions identified by said image processing means;
tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and
test parameter updating means for updating the image processing parameters and the defect determining parameters stored in said test parameter storing means based on said standard shape characterizing amounts;
wherein said image detecting means is capable of detecting a brightness image of said object under testing;
wherein said image processing means detects a lead width from said brightness image;
wherein said tested-object shape accumulating means accumulates said lead width; and
wherein said tested-object standard shape estimating means estimates that the narrowest peak indicates an actual lead width within peaks in a histogram for lead widths stored in said tested-object shape accumulating means.

9. A solder testing apparatus comprising image detecting means for detecting an appearance image of a soldered portion of an electronic component under testing mounted by soldering leads of the electronic component to Dads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining parameters stored in said test parameter storing means;

wherein said image processing means calculates shape factors of a lead and a pad for each soldered portion as shape characterizing amounts for the soldered portion, and said solder testing apparatus further comprising:
tested-object shape accumulating means for storing shape characterizing amounts of soldered portions identified by said image processing means;
tested-object standard shape estimating means for identifying design shape factors of leads and pads as standard shape characterizing amounts, and extracting said standard shape characterizing amounts from the accumulated shape characterizing amounts for soldered portions, based on the shape characterizing amounts for soldered portions stored in said tested-object shape accumulating means; and test parameter updating means for updating the image processing parameters and the defect determining parameters stored in said test parameter storing means based on said standard shape characterizing amounts;

wherein said test parameter storing means stores shape factors of leads and pads at design time, inputted by a user; and wherein said tested-object standard shape estimating means compares said shape factors inputted by the user with shape characterizing amounts for a non-defective soldered portion estimated based on shape characterizing amounts stored in said tested-object shape accumulating means, determines that an erroneous estimation has been made if a difference derived from the comparison is larger than a set threshold value, and does not update the test parameters.

10. A solder testing apparatus comprising image detecting means for detecting an appearance image of a soldered portion of an electronic component under testing mounted by soldering leads of the electronic component to pads on a printed circuit board; image processing means for performing image processing on said appearance image to identify shape characterizing amounts of said soldered portion; test parameter storing means for storing image processing parameters used in said image processing means and defect determining parameters used for determining whether said soldered portion is good or bad; and defect determining means for determining whether said soldered portion is good or bad from data derived from said image processing means and the defect determining parameters stored in said test parameter storing means, wherein said image processing means calculates shape factors of a lead and a pad for each soldered portion as shape characterizing amounts for the soldered portion, and said solder testing apparatus further comprising:

tested-object shape accumulating means for storing shape characterizing amounts of soldered portions identified by said image processing means;

tested-object standard shape estimating means for statistically processing the shape characterizing amounts for soldered portions, accumulated in said tested-object shape accumulating means for each type of electronic component mounted on the printed circuit board, to identify, from said stored shape characterizing amounts for soldered portions, shape factors of leads and pads which exhibit a low detecting frequency or which cannot be normally derived theoretically from a structural viewpoint, as unnecessary shape characterizing amounts, and to identify shape factors of leads and pads which exhibit a high detecting frequency as standard shape characterizing amounts, and for extracting said standard shape characterizing amounts from said accumulated shape characterizing amount for the soldered portions; and test parameter updating means for updating the image processing parameters and the defect determining parameters stored in said test parameter storing means based on said standard shape characterizing amounts.

11. A solder testing apparatus according to claim 10, wherein said image processing means identifies, for each soldered portion, shape factors of a solder fillet, together with the shape factors of a lead and a pad, as shape characterizing amounts for the soldered portion; and wherein said tested-object standard shape estimating means statistically processes the shape characterizing amounts for the soldered portions stored in said tested-object shape accumulating means for each model to identify, from said accumulated shape characterizing amounts for the soldered portions, shape characterizing amounts corresponding to shape factors of leads and pads and shape factors of defective solder fillets which exhibit a low detecting frequency or which cannot be normally derived theoretically from a structural viewpoint, as unnecessary shape characterizing amounts, and to identify shape characterizing amounts corresponding to shape factors of leads and pads and shape factors of non-defective solder fillets which exhibit a high detecting frequency as standard shape characterizing amounts, and extracts said standard shape characterizing amounts from said accumulated shape characterizing amount for the soldered portions.

12. A solder testing apparatus according to claim 11, wherein said shape factors of solder fillets in said image processing means comprise at least one of a height of a fillet, a width of the fillet, an area of the fillet in contact with a lead, a length of the fillet, a volume of the fillet, and a wet angle at a portion at which the fillet is in contact with the lead.

13. A solder testing apparatus according to claim 12, wherein said defect determining means performs good/bad determination in combination of said fillet height and said wet angle at a portion at which a fillet is in contact with a lead, and determines as defective if said fillet height derived from said appearance image is lower than a threshold value set in correspondence to said fillet height, and if said wet angle derived from said appearance image is smaller than a threshold value set in correspondence to said wet angle.

14. A solder testing apparatus according to claim 10, wherein said tested-object standard shape estimating means extracts shape characterizing amounts for a non-defective unit based on shape characterizing amounts of soldered portions from an appropriate number of printed circuit boards for each type of lead.

15. A solder testing apparatus according to claim 10, wherein the image processing parameters and the defect determining parameters updated by said test parameter updating means are recorded in a storage unit at predetermined time intervals together with model numbers of electronic components, date and time.

16. A solder testing apparatus according to claim 15, wherein said image processing parameters and said defect determining parameters recorded at predetermined time intervals are automatically preserved as backup when they have been recorded a predetermined number of times.

17. A solder testing apparatus according to claim 16, wherein said tested-object standard shape estimating means derives a histogram for or a mean value of shape characterizing amounts accumulated in said tested-object shape accumulating means for each type of lead or for each of groups when the leads are divided into the groups, and extracts said standard shape characterizing amounts based on a peak position of said histogram or said mean value.

18. A solder testing apparatus according to claim 10, wherein said tested-object standard shape estimating means approximates the shape characterizing amounts accumulated in said tested-object shape accumulating means with a first-order straight line; and wherein said defect determining means determines whether a soldered portion is good or bad by comparing a shape characterizing amount of the soldered portion derived from said image processing means with said first-order straight line.

19. A solder testing apparatus according to claim 10, wherein said image detecting means is capable of detecting a surface height image of said object under testing;

wherein said image processing means detects a height of a top surface of a lead and a height of a surface of a pad from said surface height image;

wherein said tested-object shape accumulating means accumulates a value derived by subtracting the pad surface height from the lead top surface height as a lead thickness; and wherein said tested-object standard shape estimating means estimates that a peak for the smallest lead thickness indicates an actual lead thickness within peaks in a histogram for lead thicknesses accumulated in said tested-object shape accumulating means.

20. A solder testing apparatus according to claim 10, wherein said image detecting means is capable of detecting a brightness image of said object under testing;

wherein said image processing means detects a lead width from said brightness image;

wherein said tested-object shape accumulating means accumulates said lead width; and wherein said tested-object standard shape estimating means estimates that the narrowest peak indicates an actual lead width within peaks in a histogram for lead widths stored in said tested-object shape accumulating means.

21. A solder testing apparatus according to claim 10, wherein said test parameter storing means stores shape factors of leads and pads at design time, inputted by a user; and wherein said tested-object standard shape estimating means compares said shape factors inputted by the user with shape characterizing amounts for a non-defective soldered portion estimated based on shape characterizing amounts stored in said tested-object shape accumulating means, determines that an erroneous estimation has been made if a difference derived from the comparison is larger than a set threshold value, and does not update the test parameters.

* * * * *